(12) United States Patent
Li et al.

(10) Patent No.: US 6,317,197 B1
(45) Date of Patent: Nov. 13, 2001

(54) MASK PELLICLE REMOVE TOOL

(75) Inventors: Meng-Chun Li, Taipei; Liu Hsieh-Mei, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/345,361

(22) Filed: Jul. 1, 1999

Related U.S. Application Data

(62) Division of application No. 08/813,567, filed on Mar. 7, 1997, now Pat. No. 5,953,107.

(51) Int. Cl.⁷ .......................... G03B 27/58; G03B 27/62; B26D 3/00; B23P 19/04
(52) U.S. Cl. ................ 355/74; 355/75; 83/870; 29/239
(58) Field of Search ................ 29/239–252; 355/71–77; 430/5; 81/3.07–3.49, 3.57; 30/167.1, 183, 184, 185; 254/120–124, 128–131, 131.5; 83/11, 870

(56) References Cited

U.S. PATENT DOCUMENTS

| | | | |
|---|---|---|---|
| 334,061 | * 1/1886 | Tobias et al. | 81/3.31 |
| 1,747,330 | * 2/1930 | Sotrmont | 254/121 |
| 1,819,445 | * 8/1931 | Soeffker | 254/120 |
| 2,680,003 | * 6/1954 | Feinstein | 254/131 |
| 2,712,433 | * 7/1955 | Holt | 254/121 |
| 4,255,216 | * 3/1981 | Conant et al. | 156/80 |
| 4,387,609 | * 6/1983 | Polsfuss | 81/3.36 |
| 4,637,713 | 1/1987 | Shulenberger et al. | 355/76 |
| 4,898,058 | * 2/1990 | Seifert | 83/870 |
| 5,311,250 | 5/1994 | Suzuki et al. | 355/76 |
| 5,422,704 | 6/1995 | Sego | 355/53 |
| 5,619,898 | * 4/1997 | Witt | 83/870 |
| 5,716,061 | * 2/1998 | Sloan et al. | 280/43.23 |
| 5,772,842 | * 6/1998 | Tanaka et al. | 156/584 |
| 5,865,670 | * 2/1999 | Frank et al. | 451/339 |
| 5,876,224 | * 3/1999 | Chadbourne | 439/110 |
| 5,953,107 | * 9/1999 | Li et al. | 355/77 |
| 5,976,307 | * 11/1999 | Cook | 156/344 |

\* cited by examiner

*Primary Examiner*—Russell Adams
*Assistant Examiner*—Rodney Fuller
(74) *Attorney, Agent, or Firm*—George O. Saile; Stephen B. Ackerman

(57) ABSTRACT

A mask pellicle removal apparatus for separating a mask pellicle from a glass reticle to which it is bonded by prying against its releasable bond. The apparatus includes a table support for nesting the glass reticle and for supporting a manually operated prying mechanism having only the necessary degrees of freedom for prying free the mask pellicle without damaging the glass reticle.

4 Claims, 5 Drawing Sheets

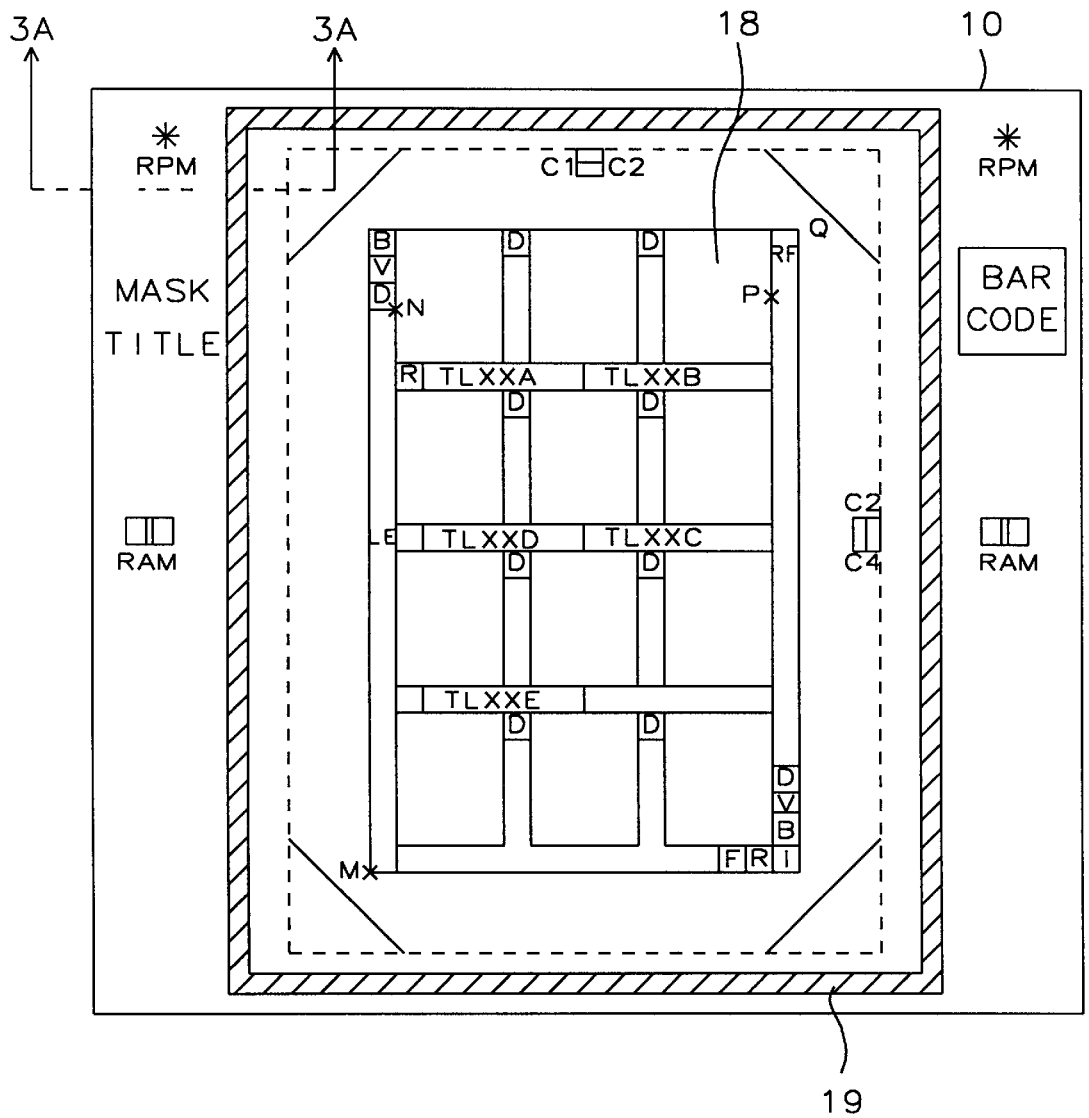
FIG. 3 - Prior Art

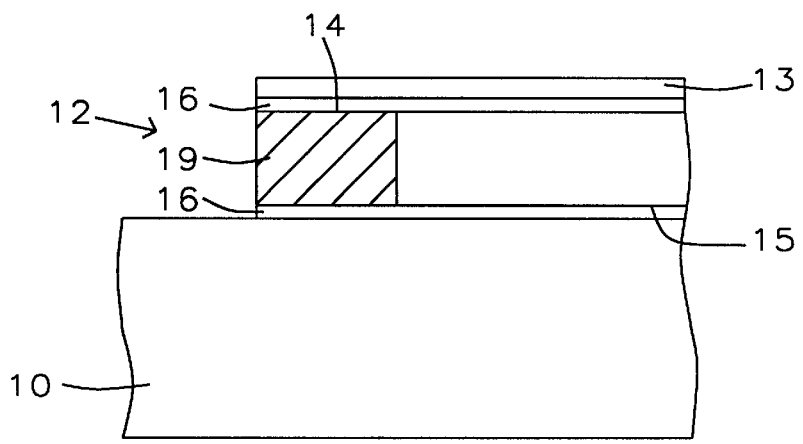
FIG. 3A – Prior Art
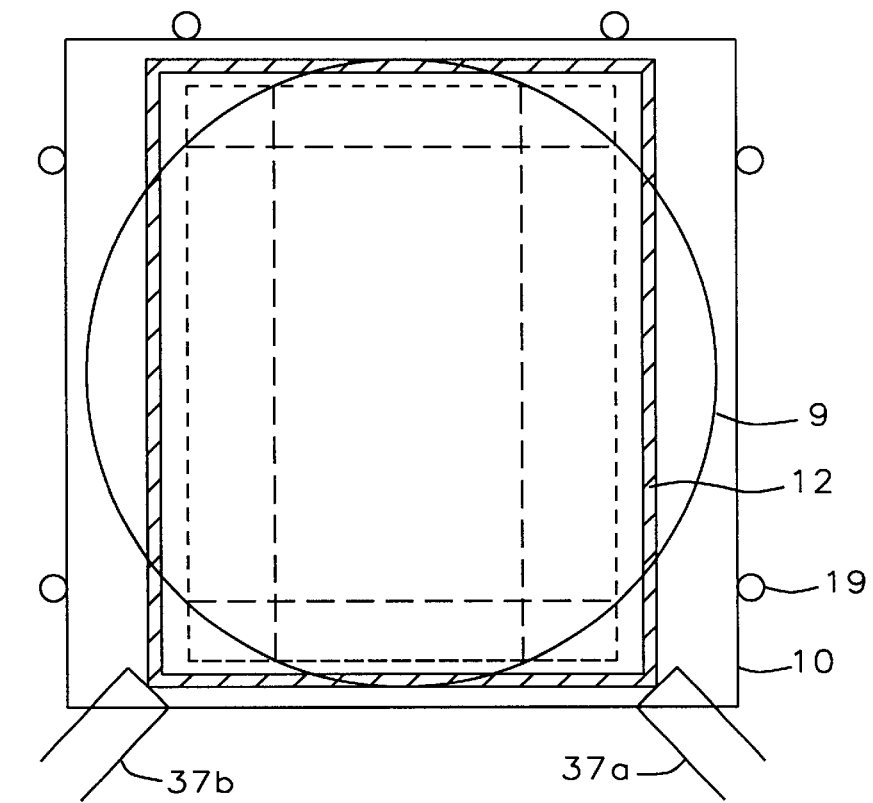
FIG. 4 – Prior Art

MASK PELLICLE REMOVE TOOL

This is a division of patent application Ser. No. 08/813,567, filing date Mar. 7, 1997 now U.S. Pat. No. 5,953,107, Mask Pellicle Remove Tool, assigned to the same assignee as the present invention.

BACKGROUND OF THE INVENTION (1) Technical Field

This invention applies generally to methods of photoprinting microcircuit patterns on photosensitive coated substrates used in the manufacture of semiconductor slices and more particularity, to a method and apparatus for removing a pellicle frame from a surface of a photomask consisting of an array of enlarged circuit patterns.

(2) Description of the Prior Art

The following three documents relate to various methods dealing with pellicle mounting apparatus.

U.S. Pat. No. 4,637,713 issued Jan. 20, 1987 to Shulenberger et al, discloses a pellicle mounting apparatus having a pair of pellicle holder assemblies positioned on either side of a photomask holder assembly.

U.S. Pat. No. 5,311,250 issued May 10, 1994 to Suzuki et al, shows another pellicle mounting apparatus.

U.S. Pat. No. 5,422,704 issued Jun. 6, 1995 to D. Sego discloses a pellicle frame.

A wafer for the manufacture of a semi-conductive elements is subjected to numerous sequenced operations which enable the fabrication of all its circuit elements. The use of a photo resist material in conjunction with photograhic masks provides the means to transfer the various pattern layers to the semiconductor wafer. The photo mask carries an enlarged pattern which is optically reduced upon each wafer's surface by projection printing. The layers upon which these images are to be reproduced are either a semiconductor, an oxide on a semiconductor, or a metal film covering the semiconductor.

The image formed in the photo resist can not be better than the photomask used to determine the exposed and unexposed areas. The most important characteristics that the image must possess are; dimensional correctness, uniform density in both clear and opaque areas, and sharp definition between clear and opaque areas.

In most applications, thousands of images are formed on a single photomask. A sequenced series of photomasks is required to complete a given semi-conductive device. Each mask controls the exposure of window patterns on wafers coated with photo sensitive resist material. This resist material is processed (developed) to wash away the exposed resist which permits access through the windows for depositing, implanting, or etching a variety of materials.

Multiple mask images which make up a mask series are produced with a defined, closely controlled spacing. In most semiconductor manufacturing operations, a series of photomasks are required to produce finished semi-conductive devices. Since the series of masks are used sequentially, mask alignment and the center to center spacing between features produced by successive masks must conform to preceding mask images to form a coherent array of materials in the layers of the devices being built.

It is well known that during the manufacture of semiconductive devices the goal is to achieve defect free exposures of circuit patterns. As integrated circuits evolved from small scale integration to very large scale integration the need for ultra clean manufacturing space became increasingly critical. As an example, a single airborne particle landing on the photomask surface during exposure can ruin the circuit exposed on the wafer below it.

To help solve this problem, the photolithographic industry developed pellicles to intercept particulates and protect the surfaces of photomasks against all forms of contamination. Pellicles include a thin, transparent membrane stretched across a frame. The frame holds the membrane in tension and keeps it away from the mask surface by the thickness of the frame. An adhesive is used to bond the frame to a surface of the photomask.

Because of the obvious inherent simplicity of this device, it has found use over a very wide range of the electromagnetic spectrum. The pellicle concept has been used in the optical industry for many years. A transparent membrane would have the effect of increasing the number of wavelengths in an optical path, or as a beam splitter in interferometry. Its application has been extended to photolithography by intercepting dust particles and other contaminents from reaching the focal plane of photomasks.

Many difficulties have been fronted in properly removing pellicle assemblies from photomasks. This procedure is necessary when cleaning or replacing damaged pellicle membranes. Presently, this job is done manually with the aid of simple hand tools and a stereomicroscope. Techniques for removing pellicle assemblies from photomasks vary widely. Each technician developes their own procecure and craftiness therefore, at times, cause costly miscues.

SUMMARY OF THE INVENTION

It is a primary object of the present invention to provide apparatus for removing pellicle assemblies from a photomask without damaging the photomask's image quality.

Another object of the present invention is to standardize the removal process of pellicle assemblies by eliminating the crafty dependance of an operator.

In accordance with the objects of this invention, a new method and apparatus is provided to standardize the removal of pellicle assemblies from photomasks. This invention describes an apparatus that requires less skill and training with little chance of damaging the photomask or producing inbedded particulates on the plane of the mask's circuit pattern causing repeating shorts or opens during a wafer's exposure process.

Briefly, the invention describes a mechanical apparatus that permits only the degrees of freedom necessary for removing the pellicle assembly from the photomask. The mechanical apparatus is positioned inline with a pellicle/photomask nesting station. A mask is placed within the nesting station, the apparatus is then moved towards the pellicle/photomask assembly until a pair of prying arms come into contact with adjacent corners of the pellicle at the bonded interface between the pellicle frame and photo mask. The materials making contact with the pellicle assembly and photomask especially in the area of prying are delicate in composition and non-obtrusive to the photomask's glass surface.

BRIEF DESCRIPTION OF THE DRAWINGS

FIG. 3 is a top view of a typical 5x photomask, of the prior art, with a mask pellicle in place showing a layout of an array of reticle cells.

FIG. 3A is a fragmentary view of an attached mask pellicle of the prior art.

FIG. 4 is a top view representation of a six inch, 5x photomask showing the lens image exposure area relative to the pellicle frame.

DETAILED DESCRIPTION OF THE PREFERRED EMBODIMENT

Figure 1:
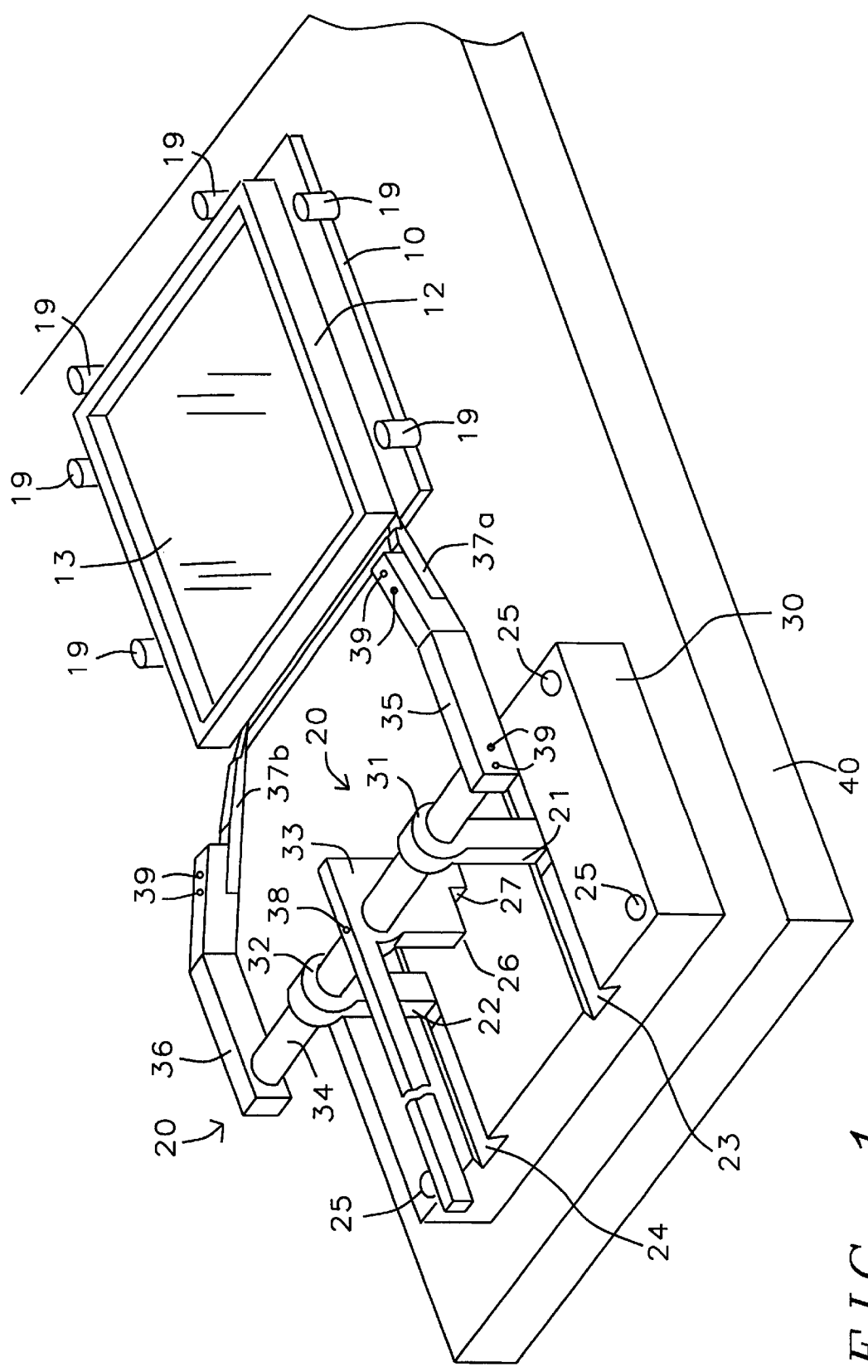
FIG. 1 is an isometric view of the present invention shown in its working position for removing a mask pellicle.

An embodiment of the present invention will be described with reference to the drawings. Referring briefly to FIGS. 3 and 3A an array of reticle cells 18 is etched through a thin metal plating deposited on the surface of a glass substrate 10 and protected from particulates and other forms of contamination by a pellicle frame assembly 12. Assembly 12 consists of an aluminum frame 19 with a pellicle membrane 13 having an anti-reflection coating thereof. The pellicle membrane is stretched and adhered with an adhesive 16 to the top surface 14 of frame 19 effecting a transparent and protective top enclosure. Assembly 12 is placed on the glass substrate and aligned to encompass the reticle array. The bottom edge of the aluminum frame 15 is bonded with adhesive 16 to the image side of the glass substrate. The bonding of the pellicle membrane to the aluminum frame and the pellicle frame assembly to the glass reticle is done off line, and prior to a lithographic exposure.

All references to the pellicle frame assembly will hereafter be referred to as mask pellicle.

The present invention is utilized when the mask pellicle requires cleaning or is damaged. The bonded mask pellicle must be removed from the glass photomask without damaging the reticle pattern.

Figure 1A:
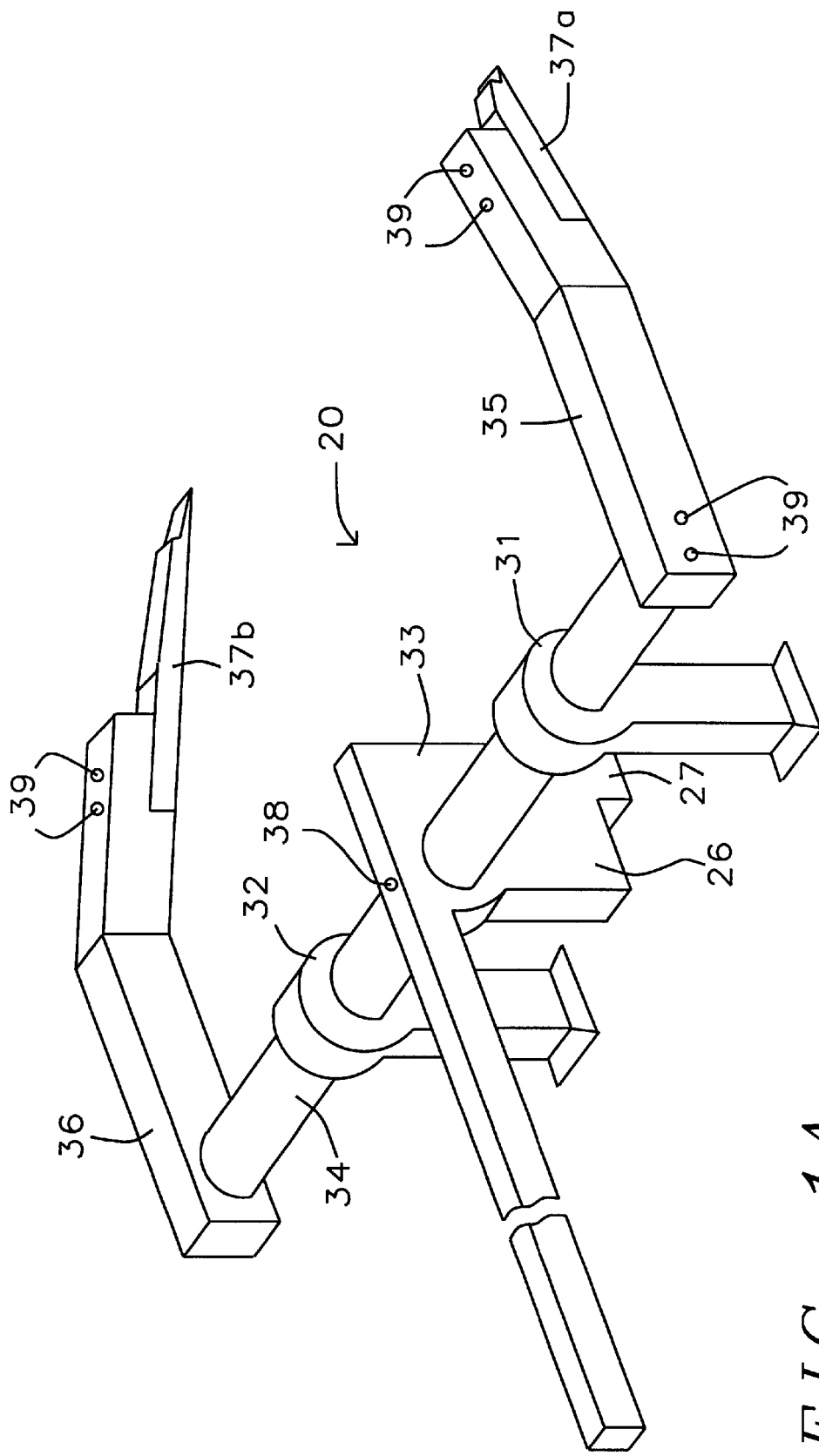
FIG. 1A is an isometric view of the present invention illustrating the upper mask pellicle removal apparatus.

FIGS. 1 and 1A are illustrations showing a mask pellicle removal apparatus according to the embodiment. With reference to FIG. 1, a base 30 is a heavy, flat plate which provides stability for a prying mechanism 20 shown in FIG. 1A. A pair of bearing plates 21 and 22 having one end slidably engaged with parallel dovetail guides 23 and 24 are spaced apart and recessed in the base said bearing plates extend upward to a rotatable shaft 34 which is transversely placed through journal bearings 31 and 32 located at the other end of the bearing plates. L shaped Lever 33 is disposed intermediate the bearing plates and the horizontal lever member fixed horizontally to the pivot shaft with a locking screw 38. The vertical member of the lever is bifurcated to limit the lever rotation by the space between members 26 and 27 with base 30. Making member 26 shorter relative to member 27 permits a greater downward rotation of the horizontal member. A right arm 35 and a left arm 36 are each mounted with two screws 39 at opposite ends of the pivot shaft. The arms designed to converge downward are mounted parallel to each other on opposite ends of the pivot shaft and extend forward horizontally to midway its length are then angled downward while converging as best illustrated in FIG. 1. Blade insert 37a is mounted with two screws 39 to the forward end of arm 35 and blade insert 37b is mounted with two screws 39 to the forward end of arm 36. The blade inserts are made of a teflon base material, polyvinylidenefluoride, having sufficient strength for prying off the mask pellicle from the glass reticle yet resilient not to cause damage to the glass or reticle array. The blade inserts are shaped to fit under a recessed front portion of the arms, and tapered in two steps. The first step is to allow visual access for positioning of the blade inserts towards the bottom edge of the mask pellicle and the second tapered step forms a sharp edge that is used for prying the mask pellicle from the glass reticle.

Base 30 with the manually operated prying mechanism that is used to remove the mask pellicle is positioned, aligned, and secured to a table surface 40 with 4 corner screws 25 behind a pattern of raised dowel pins 19 pressed into a plurality of holes in the table surface forming a bordered nest for the glass reticle as illustrated in FIG. 1.

FIG. 4 shows the positions of blade inserts 37a and 37b relative to the reticle pattern and the edge of the glass reticle. As pictured, the operating space for removing the mask pellicle is limited by both the glass edge at the outside of the frame and the reticle pattern at the inside of the frame. Care must be taken to avoid damage to the reticle pattern and the glass surface.

During photolithography, an exposing apparatus is used in semi-conductor manufacturing. A lens exposure field 9 is shown in FIG. 4 during a typical exposure of a pellicle shielded retical array.

Figure 2:
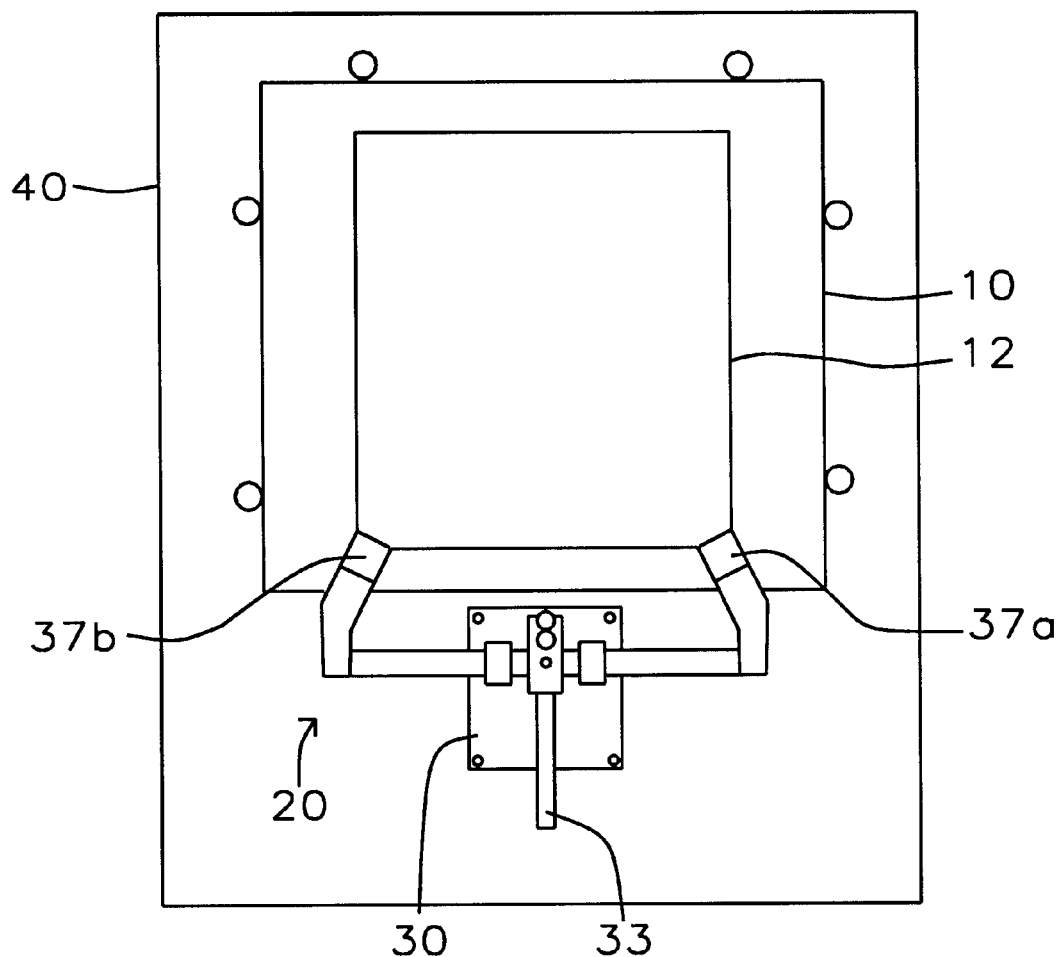
FIG. 2 is an abbreviated top view illustration of the present invention.

The operating procedure for the use of apparatus 20 will be discussed with primary reference to FIGS. 1 and 2. The procedure begins with the placement of the glass reticle 10, with its mask pellicle attached, onto a table 40 within a bounding location defined by pins 19. Lever 33 is depressed to lift the blade inserts above the top surface of the glass reticle while the upper portion of assembly 20 is moved slidably towards the mask pellicle while lowering the blade inserts to gently rest on the glass reticle until contact is made between the blade inserts and the bottom edge of the mask pellicle. Forward pressure is applied to the upper assembly 20 while depressing lever 33. The pressure angle imposed on the bottom edge of the mask pellicle by the blade inserts and its angle of rotation will generate shear and tensile force components sufficient to dislodge the adhesion bond between the mask pellicle and glass substrate. The mask pellicle is then carefully lifted away from the glass reticle. Both translating and rotating motions are limited by preset mechanical stops, not shown, to avoid overtravel that may excessively push or lift the loosened mask pellicle thereby causing damage to the unprotected reticle pattern or to the glass surface.

While the invention has been particularly shown and described with reference to the preferred embodiments thereof, it will be understood by those skilled in the art that various changes in form and details may be made without departing from the spirit and scope of the invention.

What is claimed is:

1. A mask pellicle removal apparatus for removing a mask pellicle from a glass reticle, said apparatus comprising:
   a) a support base provided with parallel dovetail tracks;
   b) a manually operated prying mechanism coupled to said dovetail tracks of said support base;
   c) a table surface for mounting said support base; and;
   d) a pattern of raised pins positioned to the front of said support base on said table surface for positioning and nesting a glass reticle.

2. A mask pellicle removal apparatus according to claim 1 wherein said parallel dovetail tracks allow said manually operated prying mechanism limited forward and backward translational freedom.

3. A mask pellicle removal apparatus according to claim 1 wherein said table surface has a prearranged first pattern of holes used to position said mask pellicle removal apparatus behind a second pattern of holes, said second pattern of holes fixes the location of said glass reticle to front of said mask pellicle removal apparatus.

4. A manual prying mechanism for prying a mask pellicle comprising:
   a) A pair of bearing plates having one end slidably engaged with a pair of parallel guides recessed and spaced apart in a base member; and,
   b) a shaft transversely extending through journal bearings at other end of said bearing plates;
   c) an inverted L shaped lever disposed intermediate said bearing plates, said lever is fixedly mounted for rotation with said shaft,
   d) a left and right arm member having one end secured to opposing ends of said shaft, said left and right arm members are shaped to converge downward to establish an advantageous pressure angle for prying, and
   e) a left and right blade inserts secured to other end of said left and right arm member.

* * * * *

UNITED STATES PATENT AND TRADEMARK OFFICE
CERTIFICATE OF CORRECTION

PATENT NO.    : 6,317,197 B1
DATED         : November 13, 2001
INVENTOR(S)   : Meng-Chun Li and Hsieh-Mei Liu It is certified that error appears in the above-identified patent and that said Letters Patent is hereby corrected as shown below:

<u>Title page,</u>
Item [75], delete "Liu Hsieh-Mei" and replace with -- Hsieh-Mei Lui --.

Signed and Sealed this

Sixth Day of August, 2002

*Attest:*

*Attesting Officer*

JAMES E. ROGAN
*Director of the United States Patent and Trademark Office*